(12) United States Patent
Bzowej et al.

(10) Patent No.: US 11,827,816 B2
(45) Date of Patent: Nov. 28, 2023

(54) ADHESIVE COMPOSITION COMPRISING A POLYURETHANE AND A CATIONIC DOPANT

(71) Applicant: E INK CORPORATION, Billerica, MA (US)

(72) Inventors: Eugene Bzowej, Reading, MA (US); Jonathan Kim Nguyen, Rockland, MA (US); David Darrell Miller, Wakefield, MA (US)

(73) Assignee: E Ink Corporation, Billerica, MA (US)

( * ) Notice: Subject to any disclaimer, the term of this patent is extended or adjusted under 35 U.S.C. 154(b) by 435 days.

(21) Appl. No.: 17/003,169

(22) Filed: Aug. 26, 2020

(65) Prior Publication Data
US 2021/0102102 A1    Apr. 8, 2021

Related U.S. Application Data (60) Provisional application No. 62/911,742, filed on Oct. 7, 2019.

(51) Int. Cl.
| | | |
|---|---|---|
| C09J 175/04 | (2006.01) | |
| C09J 175/00 | (2006.01) | |
| C08K 5/19 | (2006.01) | |
| G02F 1/167 | (2019.01) | |
| G02F 1/1676 | (2019.01) | |
| C08G 18/08 | (2006.01) | |

(Continued)

(52) U.S. Cl.
CPC ........ *C09J 175/04* (2013.01); *C08G 18/0804* (2013.01); *C08G 18/0809* (2013.01); *C08G 18/0833* (2013.01); *C08G 71/04* (2013.01); *C08G 77/458* (2013.01); *C09J 175/00* (2013.01); *G02F 1/167* (2013.01); *G02F 1/1676* (2019.01); *C08K 5/19* (2013.01); *G02F 2202/28* (2013.01)

(58) Field of Classification Search
CPC .......... C09J 175/04; C09J 175/00; C08K 5/19
See application file for complete search history.

(56) References Cited

U.S. PATENT DOCUMENTS

| | | |
|---|---|---|
| 4,418,346 A | 11/1983 | Batchelder |
| 5,760,761 A | 6/1998 | Sheridon |
| 5,777,782 A | 7/1998 | Sheridon |

(Continued)

FOREIGN PATENT DOCUMENTS

| | | |
|---|---|---|
| EP | 0175474 A2 | 3/1986 |
| JP | 2009144051 A * | 7/2009 |

(Continued)

OTHER PUBLICATIONS

Chen, Hong et al., "Polymerized Ionic Liquids: The Effect of Random Copolymer Composition on Ion Conduction", Macromolecules, vol. 42, pp. 4809-4816 (2009).

(Continued)

*Primary Examiner* — Michael L Leonard
(74) *Attorney, Agent, or Firm* — Ioannis Constantinides (57) ABSTRACT

An adhesive composition comprising a polyurethane and a cationic polymeric dopant or a polymerizable cationic dopant may be used to form one or more adhesive layers of electro-optic assemblies. They enable improved electro-optic performance of the corresponding electro-optic devices even at low temperatures.

8 Claims, 3 Drawing Sheets

(51) Int. Cl.
*C08G 71/04* (2006.01)
*C08G 77/458* (2006.01)

(56) References Cited

U.S. PATENT DOCUMENTS

| | | |
|---|---|---|
| 5,808,783 A | 9/1998 | Crowley |
| 5,872,552 A | 2/1999 | Gordon, II et al. |
| 6,054,071 A | 4/2000 | Mikkelsen, Jr. |
| 6,055,091 A | 4/2000 | Sheridon et al. |
| 6,097,531 A | 8/2000 | Sheridon |
| 6,128,124 A | 10/2000 | Silverman |
| 6,130,774 A | 10/2000 | Albert et al. |
| 6,137,467 A | 10/2000 | Sheridon et al. |
| 6,144,361 A | 11/2000 | Gordon, II et al. |
| 6,147,791 A | 11/2000 | Sheridon |
| 6,172,798 B1 | 1/2001 | Albert et al. |
| 6,184,856 B1 | 2/2001 | Gordon, II et al. |
| 6,225,971 B1 | 5/2001 | Gordon, II et al. |
| 6,241,921 B1 | 6/2001 | Jacobson et al. |
| 6,271,823 B1 | 8/2001 | Gordon, II et al. |
| 6,301,038 B1 | 10/2001 | Fitzmaurice et al. |
| 6,866,760 B2 | 3/2005 | Paolini, Jr. et al. |
| 6,870,657 B1 | 3/2005 | Fitzmaurice et al. |
| 6,922,276 B2 | 7/2005 | Zhang et al. |
| 6,950,220 B2 | 9/2005 | Abramson et al. |
| 6,982,178 B2 | 1/2006 | LeCain et al. |
| 7,002,728 B2 | 2/2006 | Pullen et al. |
| 7,012,600 B2 | 3/2006 | Zehner et al. |
| 7,012,735 B2 | 3/2006 | Honeyman et al. |
| 7,072,095 B2 | 7/2006 | Liang et al. |
| 7,075,502 B1 | 7/2006 | Drzaic et al. |
| 7,116,318 B2 | 10/2006 | Amundson et al. |
| 7,144,942 B2 | 12/2006 | Zang et al. |
| 7,170,670 B2 | 1/2007 | Webber |
| 7,173,752 B2 | 2/2007 | Doshi et al. |
| 7,184,197 B2 | 2/2007 | Liang et al. |
| 7,236,291 B2 | 6/2007 | Kaga et al. |
| 7,312,784 B2 | 12/2007 | Baucom et al. |
| 7,321,459 B2 | 1/2008 | Masuda et al. |
| 7,339,715 B2 | 3/2008 | Webber et al. |
| 7,411,719 B2 | 8/2008 | Paolini, Jr. et al. |
| 7,420,549 B2 | 9/2008 | Jacobson et al. |
| 7,453,445 B2 | 11/2008 | Amundson |
| 7,477,444 B2 | 1/2009 | Cao et al. |
| 7,535,624 B2 | 5/2009 | Amundson et al. |
| 7,551,346 B2 | 6/2009 | Fazel et al. |
| 7,561,324 B2 | 7/2009 | Duthaler et al. |
| 7,679,814 B2 | 3/2010 | Paolini, Jr. et al. |
| 7,715,088 B2 | 5/2010 | Liang et al. |
| 7,839,564 B2 | 11/2010 | Whitesides et al. |
| 8,009,348 B2 | 8/2011 | Zehner et al. |
| 9,279,906 B2 | 3/2016 | Kang |
| 10,444,553 B2 | 10/2019 | Laxton |
| 2003/0099802 A1* | 5/2003 | Klun ................ C08K 5/0075 |
| | | 428/64.1 |
| 2003/0114560 A1* | 6/2003 | Yang ..................... C09J 7/38 |
| | | 524/186 |
| 2003/0149158 A1* | 8/2003 | Klun ..................... H05F 1/02 |
| | | 524/462 |
| 2007/0051928 A1* | 3/2007 | Horton ............. C09D 179/02 |
| | | 252/500 |
| 2015/0005720 A1 | 1/2015 | Zang |
| 2016/0012710 A1 | 1/2016 | Lu et al. |

FOREIGN PATENT DOCUMENTS

| | | |
|---|---|---|
| JP | 2009144145 A | 7/2009 |
| JP | 2013234225 A | 11/2013 |
| KR | 20080017808 A | 2/2008 |
| KR | 20150075986 A | 7/2015 |
| WO | 2015099289 A1 | 7/2015 |

OTHER PUBLICATIONS

Wood, D., "An Electrochromic Renaissance?" Information Display, 18(3), 24 (Mar. 2002).

O'Regan, B. et al., "A Low Cost, High-efficiency Solar Cell Based on Dye-sensitized colloidal TiO2 Films", Nature, vol. 353, pp. 737-740 (Oct. 24, 1991).

Bach, Udo. et al., "Nanomaterials-Based Electrochromics for Paper-Quality Displays", Adv. Mater, vol. 14, No. 11, pp. 845-848, (Jun. 5, 2002).

Hayes, R.A. et al., "Video-Speed Electronic Paper Based on Electrowetting", Nature, vol. 425, No. 25, pp. 383-385 (Sep. 2003).

Kitamura, T. et al., "Electrical toner movement for electronic paper-like display", Asia Display/IDW '01, pp. 1517-1520, Paper HCS1-1 (2001).

Yamaguchi, Y. et al., "Toner display using insulative particles charged triboelectrically", Asia Display/IDW '01, pp. 1729-1730, Paper AMD4-4 (2001).

Korean Intellectual Property Office, PCT/US2020/047944, International Search Report and Written Opinion, dated Dec. 9, 2020.

\* cited by examiner

ADHESIVE COMPOSITION COMPRISING A POLYURETHANE AND A CATIONIC DOPANT

RELATED APPLICATIONS

This application claims priority to U.S. Provisional Application No. 62/911,742 filed on Oct. 7, 2019, which is incorporated herein by reference in its entirety.

BACKGROUND OF INVENTION

The present invention relates to an adhesive composition comprising a polyurethane and a cationic polymeric dopant or a polymerizable cationic dopant. The adhesive composition may be used for forming an adhesive layer in electro-optic assemblies, enabling improved electro-optic performance even at low temperatures.

The term "electro-optic", as applied to a material or a device or a display or an assembly, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range. The terms "electro-optic device" and "electro-optic display" are herein considered synonymous. The term "electro-optic assembly" as used herein may be an electro-optic device. It may also be a multi-layered component that is used for the construction of the electro-optic device. Thus, for example, a front plane laminate, which will be described below, is also considered an electro-optic assembly.

The term "gray state" is used herein in its conventional meaning in the imaging art to refer to a state intermediate two extreme display states of a pixel, and does not necessarily imply a black-white transition between these two extreme states. For example, several of the E Ink patents and published applications referred to below describe electrophoretic displays in which the extreme states are white and deep blue, so that an intermediate "gray state" would actually be pale blue. Indeed, as already mentioned, the change in display state may not be a color change at all. The terms "black" and "white" may be used hereinafter to refer to the two extreme display states of a display, and should be understood as normally including extreme display states which are not strictly black and white, for example the aforementioned white and dark blue states. The term "monochrome" may be used hereinafter to denote a drive scheme that only drives pixels to their two extreme display states with no intervening gray states.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791. Although this type of display is often referred to as a "rotating bichromal ball" display, the term "rotating bichromal member" is preferred as more accurate since in some of the patents mentioned above the rotating members are not spherical. Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode: see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038, 6,870,657, and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT), E Ink Corporation, E Ink California, LLC and related companies describe various technologies used in encapsulated and microcell electrophoretic and other electro-optic media. Encapsulated electrophoretic media comprise numerous small capsules, each of which itself comprises an internal phase containing electrophoretically mobile particles in a fluid medium, and a capsule wall surrounding the internal phase. Typically, the capsules are themselves held within a polymeric binder to form a coherent layer positioned between two electrodes. In a microcell electrophoretic display, the charged particles and the fluid are not encapsulated within microcapsules but instead are retained within a plurality of cavities formed within a carrier medium, typically a polymeric film. Hereinafter, the term "microcavity electrophoretic display" may be used to cover both encapsulated and microcell electrophoretic displays. The technologies described in these patents and applications include:

(a) Electrophoretic particles, fluids and fluid additives; see for example U.S. Pat. Nos. 7,002,728 and 7,679,814.

(b) Capsules, binders and encapsulation processes; see for example U.S. Pat. Nos. 6,922,276, 7,184,197, and 7,411,719.

(c) Microcell structures, wall materials, and methods of forming microcells; see for example U.S. Pat. Nos. 7,072,095 and 9,279,906.

(d) Methods for filling and sealing microcells; see for example U.S. Pat. Nos. 7,144,942 and 7,715,088.

(e) Films and sub-assemblies containing electro-optic materials; see for example U.S. Pat. Nos. 6,982,178 and 7,839,564.

(f) Backplanes, adhesive layers and other auxiliary layers and methods used in displays; see for example U.S. Pat. Nos. 7,116,318 7,535,624. 7,012,735 and 7,173,752.

(g) Color formation and color adjustment; see for example U.S. Pat. Nos. 7,075,502 and 7,839,564.

(h) Methods for driving displays; see for example U.S. Pat. Nos. 7,012,600 and 7,453,445.

(i) Applications of displays; see for example U.S. Pat. Nos. 7,312,784 and 8,009,348.

(j) Non-electrophoretic displays, as described in U.S. Pat. No. 6,241,921 and U.S. Patent Application Publication No. 2015/0277160; and applications of encapsulation and microcell technology other than displays; see for example and U.S. Patent Application Publications Nos. 2015/0005720 and 2016/0012710.

Many of the aforementioned patents and applications recognize that the walls surrounding the discrete microcapsules in an encapsulated electrophoretic medium could be replaced by a continuous phase, thus producing a so-called polymer-dispersed electrophoretic display. In such a display, the electrophoretic medium comprises a plurality of discrete droplets of an electrophoretic fluid and a continuous phase of a polymeric material. The discrete droplets of electrophoretic fluid within such a polymer-dispersed electrophoretic display may be regarded as capsules or microcapsules even though no discrete capsule membrane is associated with each individual droplet; see for example, U.S. Pat. No. 6,866,760. Accordingly, for purposes of the present application, such polymer-dispersed electrophoretic media are regarded as sub-species of encapsulated electrophoretic media.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774, 6,144,361, 6,172,798, 6,271,823, 6,225,971, and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An encapsulated electrophoretic display typically does not suffer from the clustering and settling failure mode of traditional electrophoretic devices and provides further advantages, such as the ability to print or coat the display on a wide variety of flexible and rigid substrates. Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques. Thus, the resulting display can be flexible. Further, because the display medium can be printed using a variety of methods it can be made inexpensively.

Other types of electro-optic materials may also be used in the present invention. Of particular interest, bistable ferroelectric liquid crystal displays (FLC's) are known in the art.

An electrophoretic display typically comprises, in addition to the electro-optic material layer, at least two other layers disposed on opposed sides of the electro-optic material layer. One of these layers is an electrode layer. In most electro-optic devices both these layers are electrode layers, and at least one the electrode layers are patterned to define the pixels of the device. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a light-transmissive, single continuous electrode and the other electrode layer is patterned into a matrix of pixel electrodes, each of which defines one pixel of the display. That is, one of the layers is typically an electrically-conductive light-transmissive layer and the other layer, typically called backplane substrate, comprises a plurality of pixel electrodes configured to apply an electrical potential between the electrically-conductive light-transmissive layer and the pixel electrodes. In another type of electro-optic device, which is intended for use with a stylus, print head or similar movable electrode separate from the display, only one of the layers adjacent the electro-optic layer comprises an electrode, the layer on the opposed side of the electro-optic layer typically being a protective layer intended to prevent the movable electrode damaging the electro-optic material layer.

The manufacture of a three-layer electro-optic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. A very similar process can be used to prepare an electrophoretic display usable with a stylus or similar movable electrode by replacing the backplane with a simple protective layer, such as a plastic film, over which the stylus or other movable electrode can slide. In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive. Similar manufacturing techniques can be used with other types of electro-optic displays. For example, a microcell electrophoretic medium or a rotating bichromal member medium may be laminated to a backplane in substantially the same manner as an encapsulated electrophoretic medium.

The aforementioned U.S. Pat. No. 6,982,178 describes a method of assembling a solid electro-optic display (including an encapsulated electrophoretic display) which is well adapted for mass production. Essentially, this patent describes a so-called "front plane laminate" ("FPL") which comprises, in order, a light-transmissive electrically-conductive layer; a layer of a solid electro-optic medium; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will normally be viewed through the electrically-conductive layer and adjacent substrate (if present); in cases where the electro-optic medium displays a change in reflectivity at non-visible wavelengths, the term "light-transmissive" should of course be interpreted to refer to transmission of the relevant non-visible wavelengths. The substrate will typically be a polymeric film, and will normally have a thickness in the range of about 1 to about 25 mil (25 to 634 µm), preferably about 2 to about 10 mil (51 to 254 µm). The electrically-conductive layer is conveniently a thin metal or metal oxide layer of, for example, aluminum or ITO, or may be a conductive polymer. Poly(ethylene terephthalate) (PET) films coated with aluminum or ITO are available commercially, for example as "aluminized Mylar" ("Mylar" is a Registered Trade Mark) from E.I. du Pont de Nemours & Company, Wilmington Del., and such commercial materials may be used with good results in the front plane laminate.

Assembly of an electro-optic display using such a front plane laminate may be effected by removing the release sheet from the front plane laminate and contacting the adhesive layer with the backplane under conditions effective to cause the adhesive layer to adhere to the backplane, thereby securing the adhesive layer, layer of electro-optic medium and electrically-conductive layer to the backplane. This process is well adapted to mass production since the front plane laminate may be mass-produced, typically using roll-to-roll coating techniques, and then cut into pieces of any size needed for use with specific backplanes.

U.S. Pat. No. 7,561,324 describes a so-called "double release sheet" or "double release film" which is essentially a simplified version of the front plane laminate of the aforementioned U.S. Pat. No. 6,982,178. One form of the double release sheet comprises a layer of a solid electro-optic medium sandwiched between two adhesive layers, one or both of the adhesive layers being covered by a release sheet. Another form of the double release sheet comprises a layer of a solid electro-optic medium sandwiched between two release sheets. Both forms of the double release sheet are intended for use in a process generally similar to the process for assembling an electro-optic display from a front plane laminate already described, but involving two separate laminations; typically, in a first lamination, the double release sheet is laminated to a front electrode to form a front sub-assembly, and then, in a second lamination, the front sub-assembly is laminated to a backplane to form the final display, although the order of these two laminations could be reversed, if desired.

As an alternative construction, U.S. Pat. No. 7,839,564 describes a so-called "inverted front plane laminate", which is a variant of the front plane laminate described in U.S. Pat. No. 6,982,178. This inverted front plane laminate comprises, in order, at least one of a light-transmissive protective layer and a light-transmissive electrically-conductive layer; an adhesive layer; a layer of a solid electro-optic medium; and a release sheet. This inverted front plane laminate is used to form an electro-optic display having a layer of lamination adhesive between the electro-optic layer and the front electrode or front substrate; a second, typically thin layer of adhesive may or may not be present between the electro-optic layer and a backplane.

One of the performance criteria of an electro-optic assembly is the temperature window for an effective switching between the different display states. In general, as the operating temperature is reduced, switching efficiency is also reduced. The inventors of the present invention unexpectedly found that electro-optic devices with an adhesive layer that is formed using a composition comprising a polyurethane and a class of cationic polymeric dopants or a class of polymerizable cationic dopants show improved electro-optic switching performance at low temperatures.

SUMMARY OF INVENTION

Aspects of the present invention relate to adhesive compositions and electro-optic assemblies and front plane laminates including these adhesive compositions.

In one aspect, the present invention provides an adhesive composition comprising a polyurethane and a cationic polymeric dopant, the cationic polymeric dopant being represented by Formula I, Formula I wherein R3, R4, R5 are independently alkyl or alkenyl groups having a chain with from 1 to 30 carbon atoms, or —$(CH_2)_b$-Q2-R2 groups, wherein b is from 2 to 5; R1, R2 are independently selected from the group consisting of hydrogen, an alkyl group having a chain with from 1 to 30 carbon atoms, an aryl group, —OH, —SH, —$NH_2$, —NHR1', and —NR1'R1"; Q1, Q2, are independently selected from the group consisting of ethylene oxide, polyethylene oxide, propylene oxide, polypropylene oxide and mixtures thereof, wherein the polyethylene oxide has from 2 to 100 total ethylene oxide units and the polypropylene oxide has from 2 to 100 propylene oxide units; R1', R1" are alkyl groups having a chain with from 1 to 30 carbon atoms; the number average molecular weight of the cationic part of the cationic polymeric dopant is from about 400 Daltons to about 25,000 Daltons; and $Y^{n-}$ is a counter ion, which is multi-atom anion comprising at least two fluorine atom; and wherein n is from 1 to 6. The counterion may comprise at least three fluorine atoms.

In another aspect, the present invention provides an adhesive composition comprising a polyurethane and a polymerizable cationic dopant, the polymerizable cationic dopant being represented by Formula II, Formula II wherein R9 is hydrogen or a methyl group, R10 is an alkyl group having from 1 to 10 carbon atoms, q is from 1 to 5, $Y^{n-}$ is a counter ion, which is a multi-atom anion comprising at least two fluorine atoms, and n is from 1 to 6.

In another aspect, the present invention provides electro-optic assembly comprising in order: an electrically-conductive light-transmissive layer; an electro-optic material layer; a first adhesive layer; and a rear electrode comprising a plurality of pixel electrodes; wherein the first adhesive layer is formed using an adhesive composition comprising a polyurethane and a cationic polymeric dopant represented by Formula I or a polymerizable cationic dopant represented by Formula II. The electro-optic assembly may further comprise a second adhesive layer located between the electrically-conductive light-transmissive layer and the electro-optic material layer. The second adhesive layer may also be formed using the adhesive composition comprising a polyurethane and a cationic polymeric dopant represented by Formula I or a polymerizable cationic dopant represented by Formula II.

In another aspect, the present invention provides electro-optic assembly comprising in order: an electrically-conductive light-transmissive layer; an electro-optic material layer; a first adhesive layer; and a release sheet; wherein the first adhesive layer is formed using an adhesive composition comprising a polyurethane and a cationic polymeric dopant represented by Formula I or a polymerizable cationic dopant represented by Formula II.

In another aspect, the present invention provides electro-optic assembly comprising in order: a first release sheet; a first adhesive layer; an electro-optic material layer; a second adhesive layer; and a second release sheet; wherein at least one of the first adhesive layer and the second adhesive layer is formed using an adhesive composition comprising a polyurethane and a cationic polymeric dopant represented by Formula I or a polymerizable cationic dopant represented by Formula II.

The electro-optic assemblies that comprise an adhesive layer formed by the inventive adhesive compositions show improved electro-optic performance, especially at low temperatures.

Other aspects and various non-limiting embodiments of the present invention are described in the following detailed description. In cases where the present specification and document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF DRAWINGS

Various aspects and embodiments of the application will be described with reference to the following figures. It should be appreciated that the figures are not necessarily drawn to scale.

Other aspects, embodiments and features of the invention will become apparent from the following detailed description when considered in conjunction with the accompanying drawings.

DETAILED DESCRIPTION

Adhesive compositions for laminate structures are generally known. They are used to adhere together different layers of the laminate structure. Such adhesive compositions may comprise, for example, hot-melt type adhesives and/or wet-coat adhesives, such as polyurethane-based adhesives. Typically, an electro-optic assembly is a laminate structure and comprises an adhesive layer. The adhesive layer of an electro-optic assembly must meet certain requirements in relation to its mechanical, thermal and electrical properties.

The selection of a lamination adhesive for use in an electro-optic display presents certain problems. Because the lamination adhesive is normally located between the electrodes, which apply the electric field needed to change the electrical state of the electro-optic medium, the conductive properties of the adhesive may significantly affect the electro-optic performance of the display.

The volume resistivity of the lamination adhesive influences the overall voltage drop across the electro-optic medium, which is critical factor in the performance of the medium. The voltage drop across the electro-optic medium is equal to the voltage drop across the electrodes, minus the voltage drop across the lamination adhesive. On one hand, if the resistivity of the adhesive layer is too high, a substantial voltage drop will occur within the adhesive layer, requiring higher voltages between the electrodes to produce a working voltage drop at the electro-optic medium. Increasing the voltage across the electrodes in this manner is undesirable, because it increases power consumption, and may require the use of more complex and expensive control circuitry to produce and switch the increased voltages. On the other hand, if the resistivity of the adhesive layer is too low, there will be undesirable cross talk between adjacent electrodes (i.e., active matrix electrodes) or the device may simply short out. Also, because the volume resistivity of most materials decreases rapidly with increasing temperature, if the volume resistivity of the adhesive is too low, the performance of the display will vary greatly with temperatures substantially above (or below) room temperature.

For these reasons, there is an optimum range of lamination adhesive resistivity values for use with most electro-optic media, this range varying with the resistivity of the electro-optic medium. The volume resistivities of encapsulated electrophoretic media are typically around $10^{10}$ Ohm·cm, and the resistivities of other electro-optic media are usually of the same order of magnitude. Accordingly, for good electro-optic performance, the volume resistivity of the lamination adhesive is preferably in the range of about $10^8$ Ohm·cm to about $10^{12}$ Ohm·cm, or about $10^9$ Ohm·cm to about $10^{11}$ Ohm·cm, at an operating temperature of the display of around 20° C. Preferably, the lamination adhesive will also have a variation of volume resistivity with temperature that is similar to the electro-optic medium itself. The values correspond to measurements after being conditioned for one week at 25° C. and 50% relative humidity In addition to the electrical properties, the lamination adhesive must fulfill several mechanical and rheological criteria, including strength of adhesive, flexibility, ability to withstand and flow at lamination temperatures, etc. The number of commercially available adhesives, which can meet all the relevant electrical and mechanical criteria, is small.

One way to improve the electro-optic performance of an electro-optic device is the addition of ionic dopants, such as inorganic or organic salts, including ionic liquids, into the adhesive composition. Dopants may be also added into the electro-optic material layer that can also enhance the low temperature performance. For example, to improve the performance of commercially available polyurethane adhesive compositions, the compositions can be doped with salts or other materials. An example of such a dopant is tetrabutylammonium hexafluorophosphate. However, with experience it was discovered that some adhesive compositions formulated with such dopants might damage active matrix backplanes, especially those including transistors made from organic semiconductors. In addition, it was observed that many adhesive compositions are insensitive to such dopants and the corresponding electro-optic assemblies show less than optimum switching performance at low temperatures.

The present invention provides an adhesive composition, which can be used for laminate structures, including electro-optic assemblies. The adhesive composition may be cured via different mechanisms, such as thermally, chemically and/or via light activation. Depending on the curing mechanism, the adhesive compositions may also comprise, in addition to the polymer or polymers and the cationic polymeric dopant or the polymerizable cationic dopant, other additives. The dopants disclosed herein may also be used in other parts of the electro-optic assembly, such, for example, the binder of the electro-optic material layer. The adhesive compositions (and/or the binder compositions) of the present invention provide improved electro-optic performance, especially at low temperatures.

The adhesive composition of the present invention may be prepared by mixing the polyurethane dispersion or solution or the neat polyurethane with a cationic polymeric dopant or with a polymerizable cationic dopant and the other additives using equipment known in the art for mixing liquids.

The adhesive composition of the present invention comprises a polyurethane and a cationic polymeric dopant, which is represented by Formula I. Groups R3, R4, R5 are independently alkyl or alkenyl groups having a chain with from 1 to 30 carbon atoms, or —(CH$_2$)$_b$-Q2-R2 groups, wherein b is from 2 to 5; R1, R2 are independently selected from the group consisting of hydrogen, an alkyl group having a chain with from 1 to 30 carbon atoms, an aryl group, —OH, —SH, —NH$_2$, —NHR1', and —NR1'R1"; Q1, Q2, are independently selected from the group consisting of ethylene oxide, polyethylene oxide, propylene oxide, polypropylene oxide and mixtures thereof, wherein the polyethylene oxide has from 2 to 100 total ethylene oxide units and the polypropylene oxide has from 2 to 100 propylene oxide units; R1', R1" are alkyl groups having a chain with from 1 to 30 carbon atoms. Groups R3, R4, R5 may also be alkyl groups having a chain with from 6 to 22 or from 10-18 carbon atoms. Groups R1, R2 may also be independently selected from the group consisting of hydrogen, an alkyl group having a chain with from 1 to 18 carbon atoms. Thus, the molecular structure of the cationic polymeric dopant comprises a quaternary ammonium group, and at least one polyether group. The counter ion of the cationic polymeric dopant is also important for the performance of the adhesive layer. It is multi-atom anion comprising at least two fluorine atoms. The multi-atom anion may comprise at least three fluorine atoms.

Formula I

The number average molecular weight of the cationic part of the cationic polymeric dopant of the adhesive composition may be from about 400 Daltons to about 25,000 Daltons, more preferably from about 500 Daltons to about 8,000 Daltons, even more preferably from about 700 Daltons to about 5,000 Daltons, even more preferably from about 800 Daltons to about 2,000 Daltons. Herein, the molecular weight value corresponds to the number average molecular weight of the cationic species of the cationic polymeric dopant without including the multi-atom anionic counter ion. That is, the molecular weight corresponds to the number average molecular weight of single cationic polymer species containing atoms connected by covalent bonds that are present in the adhesive composition. It is clear to a person who is skilled in the art that the stoichiometry of the cationic-anionic parts of the cationic polymeric dopant will vary depending on the ratio of the positive:negative charges of the species involved.

The adhesive composition may contain cationic polymeric dopant from about 0.3 weight % to about 2 weight %, preferably from about 0.4 weight % to about 3 weight %, more preferably from about 0.5 weight % to about 1 weight % by weight of the total solids of the adhesive composition. Total solids of the adhesive composition include all components of the adhesive composition except the volatile solvent or volatile solvents. Herein, a volatile solvent is a material that have boiling point below 250° C. and it does not polymerize under the curing conditions.

The adhesive composition of the present invention may comprise a polyurethane and a cationic polymeric dopant, which is represented by Formula IA.

Formula IA wherein R1, R2 are independently hydrogen, an alkyl group having a chain with from to 30 carbon atoms, an aryl group, —OH, —SH, —NH$_2$, —NHR1', or —NR1'R1"; R6, R7 are independently alkyl or alkenyl groups having a chain with from 1 to 30 carbon atoms; Q1, Q2, are independently selected from the group consisting of ethylene oxide, polyethylene oxide, propylene oxide, polypropylene oxide and mixtures thereof, wherein the polyethylene oxide has from 2 to 100 total ethylene oxide units and the polypropylene oxide has from 2 to 100 propylene oxide units. Groups R1, R2 may also be alkyl groups having a chain with from 1 to 22 carbon atoms, or from 6 to 18 carbon atoms. The number average molecular weight of the cationic part of the cationic polymeric dopant is from about 400 Daltons to about 25,000 Daltons; and $Y^{n-}$ is a counter ion, which is multi-atom anion comprising at least two fluorine atom; and wherein n is from 1 to 6. The cationic polymer dopant of Formula IA comprises a quaternary ammonium group, and two ether or polyether group.

An example of a cationic polymeric dopant of the adhesive composition is represented by Formula IB.

Formula IB wherein R8 is selected from a group consisting of alkyl and alkenyl functional groups having from 12 to 18 carbon atoms. In this example, the molecular structure of the cationic polymeric dopant comprises a quaternary ammonium salt, wherein the nitrogen of the quaternary ammonium salt has four substituents as follows: (a) two polyether functional groups, (b) an ethyl group, and (c) a fatty alkyl/alkenyl chain. In the case of R6 being derived from tallow, this material is an ionic liquid material and is supplied by Io-li-tec Nanomaterials with a commercial name of IoLiLyte T2EG. Hydrocarbon groups derived from tallow comprise a mixture of alkyl and/or alkenyl chains with 16 and 18 carbon atoms and lesser amounts of alkyl and/or alkenyl chains with 14, 15, and 17 carbon atoms.

Another adhesive composition of the present invention comprises a polyurethane and a polymerizable cationic dopant, which is represented by Formula II. Group R9 may be hydrogen or a methyl group. Group R10 is an alkyl group having from 1 to 10 carbon atoms, or from 1 to 5 carbon atoms; q is from 1 to 5, $Y^{n-}$ is a counter ion, which is a multi-atom anion comprising at least two fluorine atoms, and n is from 1 to 6. The counterion may also be a multi-atom anion comprising at least three fluorine atoms. As can be seen in Formula II, the molecular structure of the polymerizable cationic dopant comprises a vinyl acrylate or methacrylate functional group, an imidazolium functional group and a multi-atom anion counter ion comprising at least two fluorine atoms. This monomer can be polymerized during the curing process via free radical polymerization either to provide its homopolymer or with other reactive monomers that are present in the adhesive composition via a known method, for example, irradiation via UV light in the presence of an appropriate photoinitiator, or with thermal excitation.

Formula II

The adhesive composition may comprises from about 0.05 weight % to about 5 weight % of the polymerizable cationic dopant, preferably from about 0.1 weight % to about 3 weight %, more preferably from about 0.5 weight % to about 1.5 weight % by weight of the total solids of the adhesive composition. Total solids of the adhesive composition include all components of the adhesive composition except the volatile solvent or volatile solvents. Herein, a volatile solvent is a material that have boiling point below 250° C. and it does not polymerize under the curing conditions.

The number average molecular weight of the cationic part of the polymerizable cationic dopant of the adhesive composition may be from about 183 Daltons to about 415 Daltons, more preferably from about 190 Daltons to about 300 Daltons. Herein, the molecular weight value corresponds to the number average molecular weight of the cationic species of the cationic polymeric dopant without including the multi-atom anionic counter ion. That is, the molecular weight corresponds to the number average molecular weight of single cationic polymer species containing atoms connected by covalent bonds that are present in the adhesive composition. It is clear to a person who is skilled in the art that the stoichiometry of the cationic-anionic parts of the cationic polymeric dopant will vary depending on the ratio of the positive:negative charges of the species involved.

An example of a polymerizable cationic dopant of the adhesive composition is represented by Formula II.

Formula IIA

Non-limited examples of a multi-atom anionic counter ions of the cationic polymeric dopant and the polymerizable cationic dopant include trifluoroacetate, trifluoromethyl sulfonate, tetrafluoroborate, 1,1,2,2-tetrafluoroethane sulfonic acid, fluoroantimonic acid, hexafluorophosphate, hexafluorosilicic acid, nonafluorobutanesulfonate, tris(perfluoroalkyl)trifluorophosphate, 2,2,2-trifluoromethylsulfonyl-N-cyanoamide, 2,2,2-trifluoro-N-[(trifluoromethyl)sulfonyl] acetamide, heptadecafluorooctanesulfonic acid, 1,1,1-trifluoro-N-((trifluoromethyl)sulfonyl)methanesulfonamide, bis(perfluoroethylsulfonyl)amide, bis[(trifluoromethyl)sulfonyl]imide, bis(fluorosulfonyl)imide, fluorotrifluoromethylsulfonyl imide, (fluorosulfonyl)(pentafluoroethanesulfonyl)imide, (trifluoromethylsulfonyl)(pentafluoroethanesulfonyl)imide, and (trifluoromethylsulfonyl)(nonafluorobutylsulfonyl)imide.

The adhesive composition of the present invention comprises a polyurethane. The adhesive composition of the present invention may be in a form of a polyurethane solution or a polyurethane dispersion in an aqueous or a non-aqueous medium.

In some embodiments, the adhesive composition is provided in the form of an aqueous polyurethane dispersion. For example, in some cases, an adhesive dispersion may be used directly in a coating process and/or by solutions of reactive monomers in dispersions or solutions of adhesives to form an adhesive layer as described herein. In some cases, the aqueous dispersion comprises water which may be removed (e.g., via the application of heat) after deposition of the adhesive to one or more surfaces.

The adhesive composition may contain polyurethane from about 3 weight % to about 60 weight % of a polyurethane, preferably from about 15 weight % to about 50 weight %, more preferably from about 30 weight % to about 40 weight % by weight of the total solids of the adhesive composition. Total solids of the adhesive composition include all components of the adhesive composition except the volatile solvent or volatile solvents. Herein, a volatile solvent is a material that have boiling point below 250° C. and it does not polymerize under the curing conditions.

Generally, polyurethanes are prepared via a polymerization process involving a diisocyanate. Non-limiting examples of polyurethanes include polyether polyurethanes, polyester polyurethanes, polyether polyureas, polyureas, polyester polyureas, polyester polyureas, polyisocyanates (e.g., polyurethanes comprising isocyanate bonds), and polycarbodiimides (e.g., polyurethanes comprising carbodiimide bonds). The polyurethanes may be prepared using methods known in the art. Generally, a polyurethane is formed by reaction of at least one diisocyanate compound with a secondary reagent comprising at least two groups, which are capable of reacting with an isocyanate group. The secondary reagent may be a diol or a polyol. The diol may be an oligomer with two or more reactive alcohol groups. Non-limiting examples of difunctional polyols include polyethylene glycol, polypropylene glycol (PPO), and polytetramethylene glycol. The secondary reagent may be a diamine, a polyamine, and a reagent with two or more thiol functional groups. More than one type of diisocyanate compound may be utilized, for example; more than one type of secondary reagents may be utilized.

The diisocyanate may be a linear, cyclic, or branch-chained hydrocarbons, including aromatic, cycloaliphatic, and aliphatic hydrocarbons having two free isocyanate groups. Non-limiting examples of diisocyanate compounds include 4,4-methylenebis(cyclohexylisocyanate) (H12-MDI), α,α,α,α-tetramethylxylene diisocyanate, 3,5,5-trimethyl-1-isocyanato-3-isocyanatomethylcyclohexane isophorone diisocyanate and derivatives thereof, tetramethylene diisocyanate, hexamethylene diisocyanate (HDI) and derivatives thereof, 2,4-toluene diisocyanate, 2,6-toluene diisocyanate, isophorone diisocyanate, m-isopropenyl-α,α-dimethylbenzyl isocyanate, benzene 1,3-bis(1-iscyanato-1-methylethyl, 1-5 naphthalene diisocyanate, phenylene diisocyanate, trans-cyclohexane-1,4-diisocyanate, bitolylene diisocyanate, 4,4'-diphenylmethane diisocyanate, 4,4'-diphenyl dimethyl methane diisocyanate, di- and tetraalkyl diphenyl methane diisocyanate, 4,4'-dibenzyl diisocyanate, 1,3-phenylene diisocyanate, 1,4-phenylene diisocyanate, the isomers of tolylene diisocyanate, 1-methyl-2,4-diisocyanatocyclohexane, 1,6-diisocyanato-2,2,4-trimethyl hexane, 1,6-diisocyanato-2,4,4-trimethyl hexane, 1-isocyanatomethyl-3-isocyanatomethyl-3-isocyanato-1,5,5-trimethyl cyclohexane, chlorinated and brominated diisocyanates, phosphorus-containing diisocyanates, 4,4'-diisocyanatophenyl perfluoroethane, tetramethoxy butane-1,4-diisocyanate, butane-1,4-diisocyanate, hexane-1,6-diisocyanate, dicyclohexyl methane diisocyanate, cyclohexane-1,4-diisocyanate, ethylenediisocyanate, phthalicacid-bis-isocyanatoethyl ester, also polyisocyanates containing reactive halogen atoms, such as 1-chloromethylphenyl-2,4-diisocyanate, 1-bromomethylphenyl-2,6-diisocyanate, 3,3-bis-chloromethylether-4,4'-diphenyl diisocyanate. In some embodiments, the diisocyanate compound is 4,4-methylenebis(cyclohexylisocyanate).

Some polyurethanes may be formed using a diol that comprises an ionic group (e.g., a carboxylic acid group). The ionic group may be used to stabilize the polyurethane (e.g., when dispersed in water) and/or may be utilized for crosslinking. Non-limiting examples of diols comprising an ionic group include dimethylolpropionic acid (DMPA), dimethylolbutanoic acid, dimethylolpentanoic acid, diethylolpropionic acid, diethylolbutanoic acid, 1,4-dihydroxy-2-butane sulfonic acid, 1,5-dihydroxy-2-pentane sulfonic acid, 1,5-dihydroxy-3-pentane sulfonic acid, 1,3-dihydroxy-2-propane sulfonic acid, dimethylolethane sulfonic acid, N-methyldiethanolamine, N-ethyidiethanolamine, N-propyidiethanolamine, N,N-dimethyl-2-dimethylolbutylamine, N,N-diethyl-2-dimethylolbutylamine, N,N-dimethyl-2-dimethylolpropylamine In some embodiments, the ionic group is a carboxylic acid group. Non-limiting examples of diols comprises a carboxylic acid group include dimethylolpropionic acid, dimethylolbutanoic acid, dimethylolpentanoic acid, diethylolpropionic acid, and diethylolbutanoic acid, polyester diol, and other polymeric carboxylic acid groups. In some embodiments, the diol comprising an ionic group is dimethylolpropionic acid.

While polyurethane is provided as an exemplary adhesive material, those skilled in the art would be capable of utilizing the compositions and methods described herein in adhesives comprising other types of adhesives. In some embodiments, the adhesive comprises an acrylic. In certain embodiments, the adhesive comprises two or more types of adhesives (e.g., a polyurethane and an acrylic).

The adhesive composition of the present invention may be formed by blending at least two components, which may be any combination of solution or dispersed materials in aqueous or solvent-based media. In some embodiments, the components may be formed by synthetic polymerization processes, where one component is polymerized in the presence of a second polymeric component, or both polymers may be formed simultaneously. In some cases, the adhesive composition may be formed by emulsifying polymerizable monomers in an adhesive dispersion that is used directly in the coating process, and/or by solutions of reactive monomers in dispersions or solutions of adhesives. In some cases, polymerization of the monomers may occur at the primary or secondary stages (i.e. cures) and may also help in ink surface void filling and particle coalescence (e.g., if using dispersions).

The adhesive material may comprise two or more reactive functional groups. The reactive functional groups may be positioned as end groups, along the backbone or along chains extended from the backbone.

Reactive functional groups generally refer to functional groups that present in the adhesive configured to react with one or more curing species, e.g., a crosslinking reagent, a chain-extending reagent, etc. In some embodiments, the reactive functional group reacts with a curing species to form a cured moiety such as a crosslink, a thermoplastic linkage, a bond between two types of adhesive materials, or the like. In certain embodiments, a reactive functional group may react with a curing species such as a crosslinking reagent to form a crosslink. In some cases, a reactive functional group may be configured to react with another reactive functional group under a particular set of conditions, e.g., at a particular range of temperatures. In some embodiments, a reactive functional group my react under certain conditions such that the adhesive material undergoes thermoplastic drying. Non-limiting examples of reactive functional groups include hydroxyls, carbonyls, aldehydes, carboxylates, amines, imines, imides, azides, ethers, esters, sulfhydryls (thiols), silanes, nitriles, carbamates, imidazoles, pyrrolidones, carbonates, acrylates, alkenyls, and alkynyls. Other reactive functional groups are also possible and those skilled in the art would be capable of selecting suitable reactive functional groups for use with dual cure adhesives, based upon the teachings of this specification. Those skilled in the art would also understand that the curing steps described herein do not generally refer to the formation of an adhesive material, e.g., polymerization of an adhesive backbone such as a polyurethane backbone, but the further reaction of an adhesive material such that the adhesive material forms crosslinks, undergoes thermoplastic drying, or the like such that the adhesive undergoes a substantial change in mechanical properties, viscosity, and/or adhesiveness.

In some embodiments, the functional reactive group reacts with the curing species in the presence of a stimulus such as electromagnetic radiation (e.g., visible light, UV light, etc.), an electron beam, increased temperature (e.g., such as utilized during solvent extraction or condensation reactions), a chemical compound (e.g., thiolene), and/or a crosslinker. For example, an adhesive composition comprising vinyl acrylate monomers or oligomers may be polymerized on a substrate via UV irradiation in a presence of a photoinitiator. In the case of the polymerizable cationic dopants of Formula II the dopant may be polymerized along with the vinyl acrylate monomers or oligomer and be part of the same polymer.

In another aspect, the adhesive composition may also comprise a crosslinker. The crosslinker may comprise a functional group selected from the group consisting of isocyanate, epoxy, hydroxyl, aziridine, amine, and combinations thereof. Non-limiting examples of crosslinkers include 1,4-cyclohexanedimethanol diglycidyl ether (CHDDE), neopentyl glycol diglycidyl ether (NGDE), O,O,O-triglycidyl glycerol (TGG), homopolymers and copolymers of glycidyl methacrylate, and N,N-diglycidylaniline. In some embodiments, the adhesive comprising a crosslinker may be crosslinked upon exposure to an activation temperature of the crosslinking agent. The cross-linker may be present in the adhesive composition in a concentration of between about 100 ppm and about 15,000 ppm by weight of the adhesive composition.

The adhesive composition of the present invention, comprising a polyurethane and a cationic polymeric dopant or a polymerizable cationic dopant (represented by Formula I and Formula II respectively), can be used to form an adhesive layer in an electro-optic assembly. The electro-optic assembly may comprise in order, an electrically-conductive light-transmissive layer, an electro-optic material layer in electrical contact with the electrically-conductive light-transmissive layer, a first adhesive layer, and a backplane substrate. The backplane substrate comprises a rear electrode comprising a plurality of pixel electrodes. The assembly is configured to apply an electrical potential between the electrically-conductive light-transmissive layer and the pixel electrodes. The electro-optic assembly may further comprise a second adhesive layer between the electrically-conductive light-transmissive layer and the electro-optic material layer. The electro-optic assembly may be manufactured by using a front plane laminate (FPL) comprising in order, an electrically-conductive light-transmissive layer, an electro-optic material layer, a first adhesive layer, and a release sheet. The electro-optic assembly may also be manufactured by using a double release film comprising in order, a first release sheet, a first adhesive layer, an electrically-conductive light-transmissive layer, a second adhesive layer, and a second release sheet.

Figure 1:
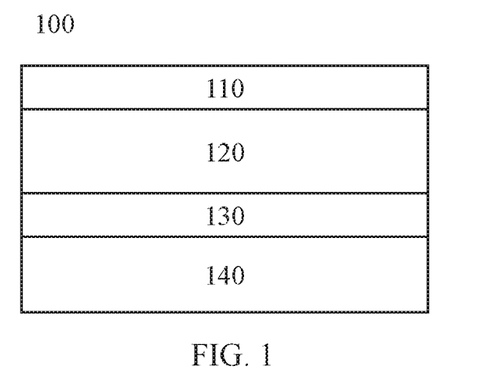
FIG. 1 is a schematic illustration of an electro-optic assembly comprising an electrically-conductive light-transmissive layer, an electro-optic material layer, a first adhesive layer, and a rear electrode layer comprising a plurality of pixel electrodes.

As illustrated in FIG. 1, in some embodiments, an electro-optic assembly 100 comprises an electrically-conductive light-transmissive layer (or front plane electrode) 110, an electro-optic material layer 120, and a rear electrode 140 comprising a plurality of pixel electrodes. As noted above, different layers of the assembly can be joined together with an adhesive layer. In FIG. 1, the rear electrode 140 is adhered to the electro-optic material layer by adhesive layer 130.

Figure 2:
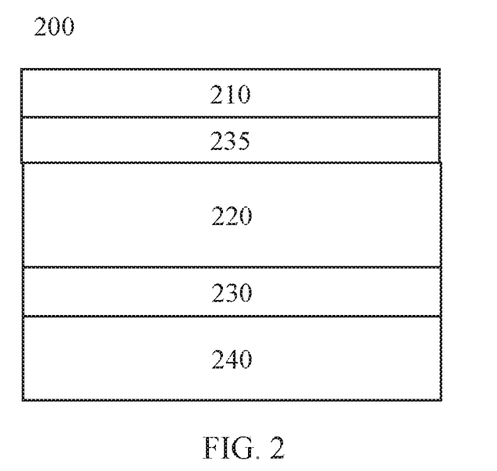
FIG. 2 is a schematic illustration of an electro-optic assembly comprising an electrically-conductive light-transmissive layer, a second adhesive layer, an electro-optic material layer, a first adhesive layer, and a rear electrode layer comprising a plurality of pixel electrodes.

In some embodiments, as illustrated in FIG. 2, more than one adhesive layer may be present in electro-optic assembly 200. Specifically, in this example, rear electrode 240 is adhered to the electro-optic material layer 220 by adhesive layer 230, and electrically-conductive light-transmissive layer 210 is adhered to electro-optic material layer 220 by adhesive layer 235, which may comprise the same or different adhesive as adhesive layer 230.

Figure 3:
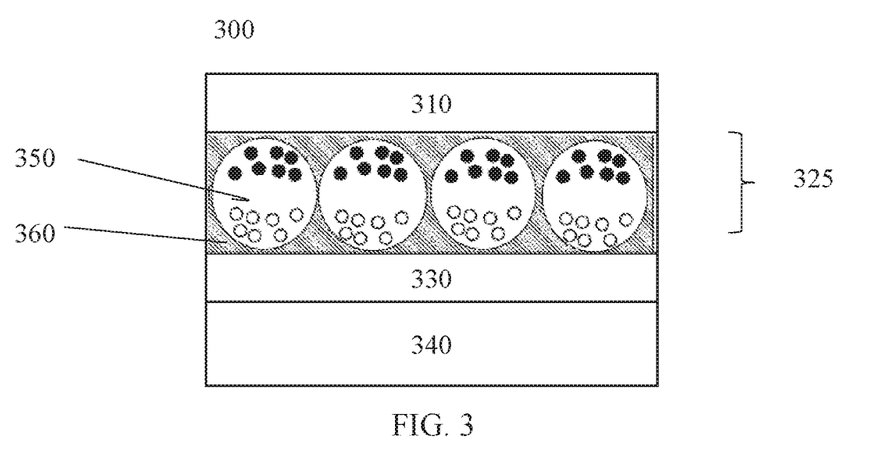
FIG. 3 is a schematic illustration of an electro-optic assembly comprising an electrically-conductive light-transmissive layer, an electro-optic material layer comprising an electrophoretic medium, a first adhesive layer, and a rear electrode layer comprising a plurality of pixel electrodes.

The electro-optic assembly may be an electrophoretic device. As illustrated in electro-optic assembly 300 of FIG. 3, an electro-optic material layer 325 may comprise capsules 350 and a binder 360. The capsules 350 may encapsulate one or more particles that can be caused to move with the application of an electric field across the electro-optic material layer 325. In some such embodiments, electrically-conductive light-transmissive layer 310 may be directly adjacent electro-optic material layer 325 and rear electrode 340 is adhered to the electro-optic material layer by first adhesive layer 330. In an exemplary embodiment, as illustrated in electro-optic assembly 400 of FIG. 4, rear electrode 440 may be adhered to electro-optic material layer 425 by first adhesive layer 430 and electrically-conductive light-transmissive layer 410 may be adhered to electro-optic material layer 425 by second adhesive layer 435. First adhesive layer 430 may be formed using the same or different adhesive compositions as the second adhesive layer 435.

The electro-optic assembly of the present invention may be a front plane laminate (FPL). In such a front plane laminate, the front plane may comprise a light-transmissive electrically-conductive layer intended to form the front electrode of a final display. The front plane may comprise a polymeric film or similar supporting layer (e.g., which supports the relatively thin electrically-conductive layer and protect it from mechanical damage). In some such embodiments, the electro-optic assembly may include a release sheet, which is removed before the front plane laminate is laminated to the backplane electrode to form the final display.

Figure 5:
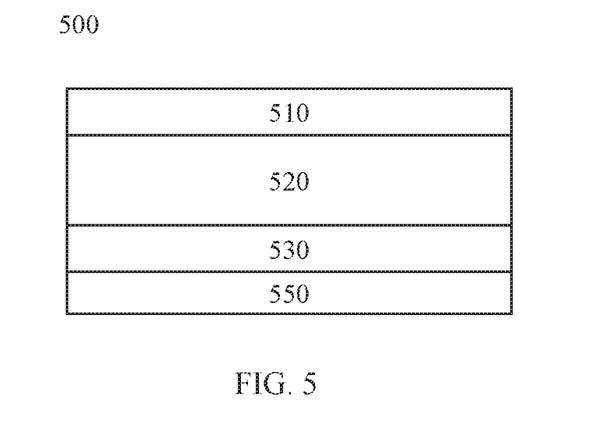
FIG. 5 is a schematic illustration of electro-optic assembly (front plane laminate) comprising an electrically-conductive light-transmissive layer, an electro-optic material layer, a first adhesive layer, and a first release sheet.

In an exemplary FPL embodiment, as illustrated in electro-optic assembly 500 of FIG. 5, electrically-conductive light-transmissive layer 510 may be adjacent to electro-optic material layer 520. Rear electrode 530 may be adhered to electro-optic material layer 520 by first adhesive layer 530. The first adhesive layer is formed using an adhesive composition comprising a polyurethane and cationic polymeric dopant represented by Formula I or polymerizable cationic dopant represented by Formula II.

Figure 6:
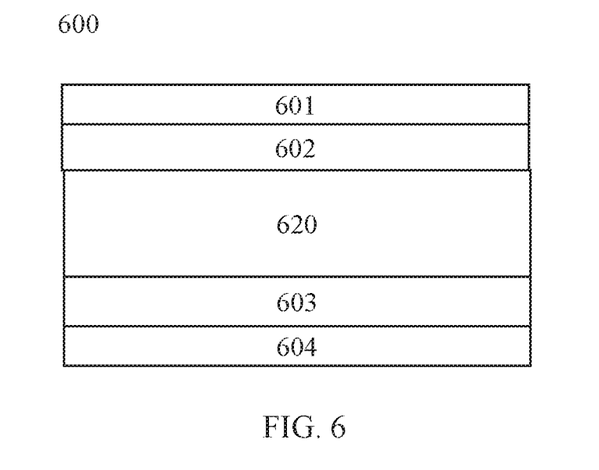
FIG. 6 is a schematic illustration of electro-optic assembly (double release film) comprising a first release sheet, a first adhesive layer, an electro-optic material layer, a second adhesive layer, and a second release sheet.

The electro-optic assembly of the present invention may be a double release film. In another exemplary double release film embodiment, as illustrated in electro-optic assembly 600 of FIG. 6, first release sheet 601 is adhered onto electro-optic material layer 620 by a first adhesive layer 602. Second release sheet 604 is also adhered to the other side of electro-optic material layer 620 by second adhesive layer 603. First adhesive layer 602 and second adhesive layer 603 may be formed using the same or different adhesive compositions. At least one the adhesive compositions comprises a polyurethane and cationic polymeric dopant represented by Formula I or polymerizable cationic dopant represented by Formula II.

It should be understood that the adhesive composition of the present invention may be used to form adhesive layers to adhere any type and number of layers to one or more other layers in an assembly, and the assembly may include one or more additional layers that are not shown in the figures. Additionally, while FIGS. 1-5 illustrate specific types of electro-optic assemblies, including encapsulated electrophoretic assemblies and devices, the adhesive composition of the present invention is useful in a variety of electro-optic assemblies, such as liquid crystal, frustrated internal reflection, and light-emitting diode assemblies.

As described above, in some embodiments, the adhesive layer is positioned between the electrically-conductive light-transmissive layer (or front plane electrode) and the rear electrode, which may apply the electric field needed to change the electrical state of the electro-optic medium of the electro-optic material layer. That is to say, the electrical properties (e.g., resistivity, conductivity) of the adhesive may change the electric field applied to the electro-optic medium. If the resistivity of the adhesive is too high, a substantial voltage drop may occur within the adhesive layer, requiring an increase in voltage across the electrodes. Increasing the voltage across the electrodes in this manner is undesirable, since it may increase the power consumption of the display, and may require the use of more complex and expensive control circuitry to handle the increased voltage involved. By contrast, if the adhesive layer, which may extend continuously across the electro-optic assembly, is in contact with a matrix of electrodes, as in an active matrix display, the volume resistivity of the adhesive should not be too low, or lateral conduction of electric current through the continuous adhesive layer may cause undesirable cross talk between adjacent electrodes. Furthermore, since the volume resistivity of most materials may decrease rapidly with increasing temperature, if the volume resistivity of the adhesive is too low, the performance of the assembly at temperatures substantially above room temperature is adversely affected. Accordingly, in some embodiments, the volume resistivity of the adhesive may range between about 108 ohm·cm and about 1012 ohm·cm, or between about 109 ohm·cm and about 1011 ohm·cm (e.g., at the operating temperature of the assembly around 200° C.). Other ranges of volume resistivity are also possible. The values correspond to measurements after being conditioned for one week at 25° C. and 50% relative humidity. The adhesive layer after curing (e.g., after a first cure and a second cure) may have a particular average coat weight. For example, the adhesive layer can have an average coat weight ranging between about 2 g/m2 and about 25 g/m2. In some embodiments, the adhesive layer has an average coat weight of at least about 2 g/m2, at least about 4 g/m, at least about 5 g/m2, at least about 8 g/m2, at least about 10 g/m2, at least about 15 g/m2, or at least about 20 g/m2. In certain embodiments, the adhesive layer has an average coat weight of less than or equal to about 25 g/m2, less than or equal to about 20 g/m2, less than or equal to about 15 g/m2, less than or equal to about 10 g/m2, less than or equal to about 8 g/m2, less than or equal to about 5 g/m2, or less than or equal to about 4 g/m2. Combinations of the above-referenced ranges are also possible (e.g., between about 2 g/m2 and about 25 g/m2, between about 4 g/m2 and about 10 g/m2, between about 5 g/m2 and about 20 g/m2, between about 8 g/m2 and about 25 glm2). Other ranges are also possible. The adhesive layer prior to curing may have a particular average wet coat thickness (e.g., such that the adhesive does not significantly alter electrical and/or optical properties of the electro-optic assembly). For example, the adhesive layer can have an average wet coat thickness ranging between about 1 microns and about 100 microns, between about 1 microns and about 50 microns, or between about 5 microns and 25 microns. In some embodiments, the adhesive layer may have an average wet coat thickness of less than about 25 microns, less than about 20 microns, less than about 15 microns, or less than about 12 microns, less than about 10 microns, or less than about 5 microns. In some embodiments (e.g., in embodiments where the adhesive is wet coated directed to an electro-optic material layer), the adhesive layer may have an average wet coat thickness between about 1 micron and about 50 microns, or between about 5 microns and 25 microns, or between about 5 microns and about 15 microns. In some embodiments (e.g., in embodiments where the adhesive is coated onto a layer and then laminated to an electro-optic material layer), the adhesive layer may have an average wet coat thickness between about 15 microns and 30 microns, or 20 microns and 25 microns. Other wet coat thicknesses are also possible.

It should be understood that the adhesive layer may cover the entire underlying layer, or the adhesive layer may only cover a portion of the underlying layer.

Further, the adhesive layer may be applied as a laminate, which usually creates a thicker adhesive layer, or it may be applied as an overcoat, which usually creates a layer that is thinner than a laminate. The overcoat layer may utilize a dual curing system where a first cure occurs prior to overcoat such that the adhesive may be coated on the electro-optic material layer surface (or another surface) and a second cure sets the material after overcoating. The overcoat layer may be rough if the underlying surface is rough and only a thin layer is applied, or the overcoat layer may be used to planarize an underlying rough surface. Planarization may occur in a single step where the overcoat layer is applied to planarize the rough surface, for example, adding sufficient adhesive to fill in any voids, smooth the surface, and minimally increase the overall thickness. Alternatively, planarization may occur in two steps. The overcoat layer is applied to minimally coat the rough surface and the second coating is applied to planarize. In another alternative, the overcoat layer may be applied to a smooth surface.

Figure 4:
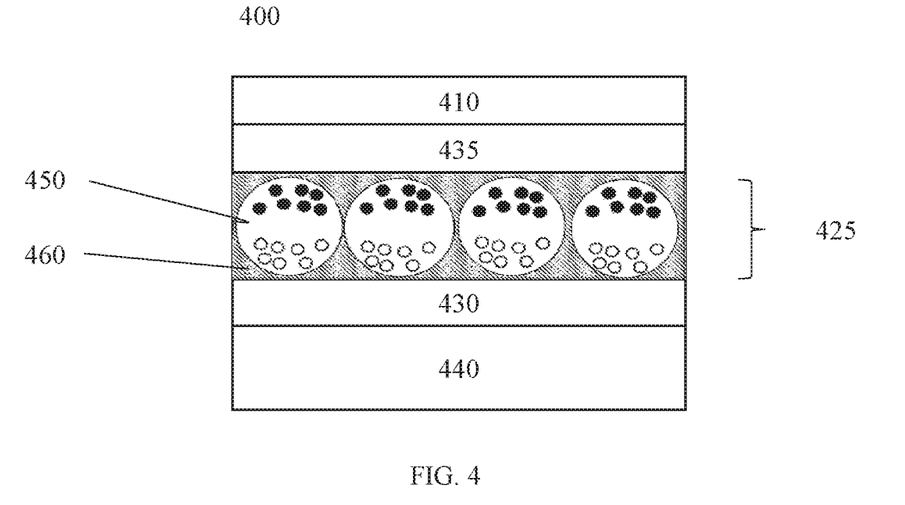
FIG. 4 is a schematic illustration of electro-optic assembly comprising an electrically-conductive light-transmissive layer, a second adhesive layer, an electro-optic material layer comprising an electrophoretic medium, a first adhesive layer, and a rear electrode layer comprising a plurality of pixel electrodes.

Referring again to FIGS. 3 (and 4), in some embodiments, the electro-optic assembly comprises electro-optic material layer 325, capsules 350, and binder 360. In certain embodiments, the binder may also be an adhesive, as described above. For example, the binder may be a polyurethane.

In some embodiments, the rear electrode comprises one or more electrode layers patterned to define the pixels of the display. For example, one electrode layer may be patterned into elongate row electrodes and a second electrode layer may be patterned into elongate column electrodes running at right angles to the row electrodes, the pixels being defined by the intersections of the row and column electrodes. Alternatively, in some embodiments, one electrode layer has the form of a single continuous electrode and a second electrode layer is patterned into a matrix of pixel electrodes, each of which defines one pixel of the display. In another type of electro-optic display, which is intended for use with a stylus, print head or similar movable electrode separate from the display, only one of the layers adjacent the electro-optic material layer comprises an electrode, the layer on the opposed side of the electro-optic material layer typically being a protective layer intended to prevent the movable electrode damaging the electro-optic material layer.

Referring again to FIGS. 1, 2, 3, 4 and 5, the electrically-conductive light-transmissive layer may comprise a polymeric film or similar supporting layer (e.g., which may support the relatively thin light-transmissive electrode and protects the relatively fragile electrode from mechanical damage) and rear electrode (where applicable) comprises a support portion and a plurality of pixel electrodes (e.g., which define the individual pixels of the display). In some cases, the backplane may further comprise non-linear devices (e.g., thin film transistors) and/or other circuitry used to produce on the pixel electrodes the potentials needed to drive the display (e.g., to switch the various pixels to the display states necessary to provide a desired image on the display).

For convenience, certain terms employed in the specification, examples, and appended claims are listed here. Definitions of specific functional groups and chemical terms are described in more detail below. For purposes of this invention, the chemical elements are identified in accordance with the Periodic Table of the Elements, CAS version, Handbook of Chemistry and Physics, 75th Ed., inside cover, and specific functional groups are generally defined as described therein. Additionally, general principles of organic chemistry, as well as specific functional moieties and reactivity, are described in Organic Chemistry, Thomas Sorrell, University Science Books, $2^{nd}$ Edition, Sausalito, 2006.

The term "aliphatic," as used herein, includes both saturated and unsaturated, nonaromatic, straight chain (i.e. unbranched), branched, acyclic, and cyclic (i.e. carbocyclic) hydrocarbons, which are optionally substituted with one or more functional groups. As will be appreciated by one of ordinary skill in the art, "aliphatic" is intended herein to include, but is not limited to, alkyl, alkenyl, alkynyl, cycloalkyl, cycloalkenyl, and cycloalkynyl moieties. Thus, as used herein, the term "alkyl" includes straight, branched and cyclic alkyl groups. An analogous convention applies to other generic terms such as "alkenyl", "alkynyl", and the like. Furthermore, as used herein, the terms "alkyl", "alkenyl", "alkynyl", and the like encompass both substituted and unsubstituted groups. In certain embodiments, as used herein, "aliphatic" is used to indicate those aliphatic groups (cyclic, acyclic, substituted, unsubstituted, branched or unbranched) having 1-30 carbon atoms, unless otherwise indicated. Aliphatic group substituents include, but are not limited to, any of the substituents described herein, that result in the formation of a stable moiety (e.g., aliphatic, alkyl, alkenyl, alkynyl, heteroaliphatic, heterocyclic, aryl, heteroaryl, acyl, oxo, imino, thiooxo, cyano, isocyano, amino, azido, nitro, hydroxyl, thiol, halo, aliphaticamino, heteroaliphaticamino, alkylamino, heteroalkylamino, arylamino, heteroarylamino, alkylaryl, arylalkyl, aliphaticoxy, heteroaliphaticoxy, alkyloxy, heteroalkyloxy, aryloxy, heteroaryloxy, aliphaticthioxy, heteroaliphaticthioxy, alkylthioxy, heteroalkylthioxy, arylthioxy, heteroarylthioxy, acyloxy, and the like, each of which may or may not be further substituted).

The term "aromatic" is given its ordinary meaning in the art and refers to aromatic carbocyclic groups, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl). That is, at least one ring may have a conjugated pi electron system, while other, adjoining rings can be cycloalkyls, cycloalkenyls, cycloalkynyls, aryls and/or heterocyclyls.

The term "aryl" is given its ordinary meaning in the art and refers to aromatic carbocyclic groups, optionally substituted, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl). That is, at least one ring may have a conjugated pi electron system, while other, adjoining rings can be cycloalkyls, cycloalkenyls, cycloalkynyls, aryls and/or heterocyclyls. The aryl group may be optionally substituted, as described herein. Substituents include, but are not limited to, any of the previously mentioned substituents, i.e., the substituents recited for aliphatic moieties, or for other moieties as disclosed herein, resulting in the formation of a stable compound. In some cases, an aryl group is a stable mono- or polycyclic unsaturated moiety having preferably 3-14 carbon atoms, each of which may be substituted or unsubstituted.

The terms "alkenyl" and "alkynyl" are given their ordinary meaning in the art and refer to unsaturated aliphatic groups analogous in length and possible substitution to the alkyls described above, but that contain at least one double or triple bond respectively.

The n− exponent of the counter ion $Y^{n-}$ of the cationic dopants represented by Formulas I and II indicates the value of the negative charge of the counterion species. In other words, if n is 1, the counterion has charge of −1; when n is 2, the counterion has charge of −2, etc.

These and other aspects of the present invention will be further appreciated upon consideration of the following Examples, which are intended to illustrate certain particular embodiments of the invention but are not intended to limit its scope, as defined by the claims.

EXAMPLES

Mixtures of polyurethane dispersion and ionic dopants. The parts indicated below are based on weight.

Comparative Example 1A: A mixture was made consisting of 286 parts of a polyurethane dispersion A (35% solids content) and 0.0500 parts of 1-butyl-3-methylimidazolium hexafluorophosphate (BMIM PF6).

Comparative Example 1B: A mixture was made consisting of 286 parts of a polyurethane dispersion A (35% solids content) and 0.0340 parts of 1-butyl-3-methylimidazolium dicyanamide (BMIM DCN).

Comparative Example 1C: A mixture was made consisting of 286 parts of a polyurethane dispersion A (35% solids content) and 0.0373 parts of 1-butyl-3-methylimidazolium boron tetrafluoride (BMIM BF4).

Example 1D1: A mixture was made consisting of 286 parts of a polyurethane dispersion A (35% solids content) and 0.0500 parts of the compound represented by Formula IA, supplied by Io-li-tec Nanomaterials with a commercial name of IoLiLyte T2EG.

Example 1D2: A mixture was made consisting of 286 parts of a polyurethane dispersion A (35% solids content) and 0.2000 parts of the compound represented by Formula IA, supplied by Io-li-tec Nanomaterials with a commercial name of IoLiLyte T2EG.

Example 1D3: A mixture was made consisting of 286 parts of a polyurethane dispersion A (35% solids content) and 0.3500 parts of the compound represented by Formula IA, supplied by Io-li-tec Nanomaterials with a commercial name of IoLiLyte T2EG.

Example 1D4: A mixture was made consisting of 286 parts of a polyurethane dispersion A (35% solids content) and 0.5000 parts of the compound represented by Formula IA, supplied by Io-li-tec Nanomaterials with a commercial name of IoLiLyte T2EG.

Example 1D5: A mixture was made consisting of 286 parts of a polyurethane dispersion A (35% solids content) and 0.6230 parts of the compound represented by Formula IA, supplied by Io-li-tec Nanomaterials with a commercial name of IoLiLyte T2EG. The ionic content of the polymeric dopant of this example 1s equivalent to the ionic content of the dopant of Comparative Example 1A1 as confirmed via an NMR experiment. The NMR method is described below.

Comparative Example 1E: A mixture was made consisting of 286 parts of a polyurethane dispersion A (35% solids content) and 0.0500 parts of 1-butyl-3-methylimidazolium hexafluorophosphate (BMIM PF6). An amount of stoichiometric amount of carbodiimide crosslinker (XL702 supplied by Picassian) was added (1:1 mole ratio of carbodiimide to carboxylic acid functionality of the polyurethane).

Comparative Example 1F: A mixture was made consisting of 286 parts of a polyurethane dispersion A (35% solids content) and 0.6405 parts of the compound represented by Formula IA, but with counter ion being ethyl sulfate. The ionic content of the polymeric dopant of this example 1s equivalent to the ionic content of the dopant of Comparative Example 1A as confirmed via a method using NMR spectrometry. An amount of stoichiometric amount of carbodiimide crosslinker (XL702 supplied by Picassian) was added (1:1 mole ratio of carbodiimide to carboxylic acid functionality of the polyurethane).

Example 1G: A mixture was made consisting of 286 parts of a polyurethane dispersion A (35% solids content) and 0.6405 parts of the compound represented by Formula IA. The ionic content of the polymeric dopant of this example is equivalent to the ionic content of the dopant of Comparative Example 1A as confirmed via an NMR experiment. An amount of stoichiometric amount of carbodiimide crosslinker (XL702 supplied by Picassian) was added (1:1 mole ratio of carbodiimide to carboxylic acid functionality of the polyurethane).

Example 1H1: A mixture was made consisting of 286 g of polyurethane dispersion A (35% solids content) and 0.0500 g of tetrabutylammonium hexafluorophosphate ($Bu_4N$ $PF_6$).

Example 1H2: A mixture was made consisting of 286 parts of polyurethane dispersion A (35% solids content) and 0.1000 parts of tetrabutylammonium hexafluorophosphate ($Bu_4N$ $PF_6$).

Example 1H3: A mixture was made consisting of 286 parts of polyurethane dispersion A (35% solids content) was mixed with 0.1500 parts of tetrabutylammonium hexafluorophosphate ($Bu_4N$ $PF_6$).

Example 1H4: A mixture was made consisting of 286 parts of polyurethane dispersion A (35% solids content) and 0.2000 parts of tetrabutylammonium hexafluorophosphate ($Bu_4N$ $PF_6$).

Electro-optic assembles were constructed using adhesive compositions from Comparative Examples 1A, 1B, 1C, 1E, 1F, 1H1, 1H2, 1H3, 1H4, and Examples 1D1, 1D2, 1D3, 1D4, 1D5, and 1G as described in the following Example 2.

Comparative Example 2A—Construction of the assembly: A 3-layer electro-optic assembly was constructed by: (a) coating an electro-optic material layer on a low energy release sheet; the electro-optic material layer comprising encapsulated electrophoretic medium with negatively charged white particles, positively charged black particles suspended in a hydrocarbon suspending fluid. The capsules were held retained within a polymeric binder; (b) then, adhesion composition of Comparative Example 1A was wet coated onto the surface of the electro-optic material layer; (c) the coating was dried in a cross draft oven, and (d) the dried coating was adhered onto a backplane electrode. The thickness of the adhesive layer was approximately 40 μm. After removing the low energy release sheet, the exposed side of the electro-optic material layer was attached to a front plane electrode to provide an electro-optic display, which was equilibrated for five days at temperature of 25° C. and a relative humidity of 50%.

Comparative Example 2B: Electro-optic assembly using adhesive composition from Comparative Example 1B.

Comparative Example 2C: Electro-optic assembly using adhesive composition from Comparative Example 1C.

Example 2D1: Electro-optic assembly using adhesive composition from Example 1D1.

Example 2D2: Electro-optic assembly using adhesive composition from Example 1D2.

Example 2D3: Electro-optic assembly using adhesive composition from Example 1D3.

Example 2D4: Electro-optic assembly using adhesive composition from Example 1D4.

Example 2D5: Electro-optic assembly using adhesive composition from Example 1D5.

Comparative Example 2E: Electro-optic assembly using adhesive composition from Comparative Example 1E.

Comparative Example 2F: Electro-optic assembly using adhesive composition from Comparative Example 1F.

Example 2G: Electro-optic assembly using adhesive composition from Example 1G.

Comparative Example 2H1: Electro-optic assembly using adhesive composition from Comparative Example 1H1.

Comparative Example 2H2: Electro-optic assembly using adhesive composition from Comparative Example 1H2.

Comparative Example 2H3: Electro-optic assembly using adhesive composition from Comparative Example 1H3.

Comparative Example 2H4: Electro-optic assembly using adhesive composition from Comparative Example 1H4.

Determination of ionic content via NMR spectroscopy: The ionic content of a dopant in the adhesive composition was determined by $^1$H-NMR spectroscopy. Specifically, a known amount of phenanthrene was mixed into a known quantity of the adhesive composition. The mixture was dissolved in CDCl3 and the $^1$H-NMR spectrum of the resulting solution was acquired. The ionic content of the dopants was measured by integration of the corresponding dopant peak in relation to the integration of the phenanthrene peak.

Optical Measurement Method: The electro-optical properties of each electro-optic assembly were measured using a PR-650 SpectraScan colorimeter. The electro-optic assembly was repeatedly driven to its white and black extreme states using electric fields. Then, it was driven to either the white or the black display state and its reflectivity was measured via the colorimeter. The measurements were repeated at different temperatures.

The value reported from the colorimeter measurement is the reflectance value L*. The L* has the optic switching performance of electro-optic devices effectiveness (where L* has the usual CIE definition):

$$L^* = 116(R/R_0)^{1/3} - 16,$$

where R is the reflectance and $R_0$ is a standard reflectance value).

The contrast ratio CR of an electro-optic device is the ratio of reflectivity of the white state to the reflectivity of the dark state. In other words, the contrast ratio is expressed by the equation $$CR = R_{WS}/R_{DS}$$

wherein $R_{WS}$ is the reflectivity of the white state and $R_{DS}$ is the reflectivity of the dark state of the device.

The contrast ratio was determined from reflectance measurements of $R_{WS}$ and $R_{DS}$ and using the above-mentioned equation. More specifically, $R_{WS}$ (reflectance of the white state) was measured using a Macbeth spectrophotodensiometer (SpectroEye supplied by GretagMacbeth) after applying a voltage of 15V between the electrodes of the device for 0.4 seconds. Then, the reflectance of the dark state was measured after switching the poles and applying a voltage of 15V between the electrodes of the device for 0.4 seconds. Higher contrast ratios are desirable.

Table 1 shows the results of this evaluation for electro-optic properties of electro-optic assemblies at 0° C. The adhesive compositions comprise non-crosslinked polyurethane.

Table 2 shows the results of this evaluation for electro-optic properties of electro-optic assemblies at 0° C. The adhesive compositions comprise crosslinked polyurethane.

Table 3 shows the results of this evaluation for electro-optic properties of electro-optic assemblies at 25° C. The adhesive compositions comprise crosslinked polyurethane.

The values represent L* (lightness value) at the white state (WS) and black state (DS). The difference DR in L* between the WS and DS for the corresponding display at the same temperature.

TABLE 1

Optical performance of electro-optical assemblies at 0° C. The adhesive composition of the adhesive layer comprises non-crosslinked polyurethane.

| Electro-optic Assembly | WS L* | DS L* | DR L* |
|---|---|---|---|
| Comparative Example 2A | 62.7 | 27.2 | 35.5 |
| Comparative Example 2B | 60.8 | 28.0 | 32.8 |
| Comparative Example 2C | 61.6 | 27.3 | 34.3 |
| Example 2D5 | 69.4 | 21.1 | 48.4 |

TABLE 2

Optical performance of electro-optical assemblies at 0° C. The adhesive composition of the adhesive layer comprises crosslinked polyurethane.

| Electro-optic Assembly | WS L* | DS L* | DR L* |
|---|---|---|---|
| Comparative Example 2E | 62.8 | 51.3 | 11.6 |
| Comparative Example 2F | 59.9 | 55.8 | 4.1 |
| Example 2G | 67.6 | 29.9 | 37.8 |

TABLE 3

Optical performance of electro-optical assemblies at 25° C. The adhesive composition of the adhesive layer comprises crosslinked polyurethane.

| Electro-optic Assembly | WS L* | DS L* | DR L* |
|---|---|---|---|
| Comparative Example 2E | 72 | 19.7 | 52.2 |
| Comparative Example 2F | 71.8 | 20.1 | 51.7 |
| Example 2G | 71.0 | 19.1 | 51.9 |

The higher the value of L* the more light is the appearance of the display state. Thus, high values are preferred for the white state (WS) and low values are preferred for the black state (DS). Larger DR correspond to better optical performance. The data indicate that inventive Examples 2D5 and 2G show better electro-optical performance at low temperatures compared to Comparative Examples 2A1, 2B, 2C, 2E, and 2F. As mentioned above the Comparative Examples 2A1, 2B, 2C, and 2E comprise cationic dopants. Comparative Example 2F comprises a cationic polymeric dopant but with non-fluorinated counter ion. Inventive Examples 2D5 and 2G comprise a cationic polymeric dopant with multi-atom counter ion comprising at least two fluorine atoms. Also, the ionic contents are similar in all of the Examples.

Comparative Example 3A: A mixture was made consisting of 330 g of an aqueous film forming polyurethane dispersion (30% solids), 1.0 parts of 1-butyl-3-methylimidazolium hexafluorophosphate (BMIM PF6) dissolved in 1 part of N-methylpyrrolidone, and 0.05 parts of 2,4,6-trimethylbenzoyldiphenyl phosphine oxide (TPO) photoinitiator were mixed.

Example 3B: A mixture was made consisting of 330 parts of an aqueous film-forming polyurethane dispersion (30% solids) used in Example 3A, 0.1 parts of compound represented by Formula IIA dissolved in 1 part of N-methylpyrrolidone, and a photoinitiator. The compound of Formula IIA was synthesized by the reaction of 2-bromoethyl acrylate and 1-ethyl-1H-imidazole as described in Hong Chen, et al "Polymerized Ionic Liquids: The Effect of Random Copolymer Composition on Ion Conduction", Macromolecules, 2009, 42, 4809-4816.

Comparative Example 4A—Construction of electro-optic assembly: A 3-layer electro-optic assembly was constructed by: (a) coating an electro-optic material layer on a low energy release sheet; the electro-optic material layer comprising encapsulated electrophoretic medium with negatively charged white particles, positively charged black particles suspended in a hydrocarbon suspending fluid. The capsules were held retained within a polymeric binder; (b) then, adhesion composition of Comparative Example 3A was wet coated onto the surface of the electro-optic material layer; (c) the coating was exposed to UV light to cure the polymer, and (d) the dried coating was adhered onto a backplane electrode. The thickness of the adhesive layer was approximately 40 μm. After removing the low energy release sheet, the exposed side of the electro-optic material layer was attached to a front plane electrode to provide an electro-optic display, which was equilibrated for five days at temperature of 25° C. and a relative humidity of 50%.

Comparative Example 4A: Electro-optic assembly using adhesive composition from Comparative Example 3A.

Example 4B: Electro-optic assembly using adhesive composition from Example 3B.

The electro-optical properties of electro-optic assembly of Examples 4A and 4B were measured as described above (Optical Measurement Method) at 0° C.

| Electro-optic Assembly | WS L* | Contrast ratio |
|---|---|---|
| Comparative Example 4A | 51.5 | 3 |
| Example 4B | 67.0 | 12.5 |

The data indicate that inventive Example 4B (comprising polymerizable cationic dopant) show better electro-optical performance at low temperatures compared to Comparative Examples 4A (comprising non-polymerizable dopant).

Without wishing to be bound by theory, dopants that exist in the adhesive layer as small molecules may diffuse and migrate in the layer and separate in their own phase or domain. This may create an adhesive layer having low and high conductivity domains and increasing the overall volume resistivity of the adhesive layer and, as a result, reducing the electro-optic switching performance of the electro-optic assembly. Such dopant separation is less likely to happen with polymeric dopants, which may be significantly less mobile and less likely to diffuse through the adhesive layer.

The invention claimed is:

1. An adhesive composition comprising a polyurethane, and a cationic polymeric dopant, the cationic polymeric dopant being represented by Formula IA, Formula IA wherein
R1, R2 are independently selected from the group consisting of hydrogen, an alkyl group having a chain with from 1 to 30 carbon atoms, an aryl group, —OH, —SH, —NH$_2$, —NHR1', and —NR1'R1";
R6, R7 are independently alkyl or alkenyl groups having a chain with from 1 to 30 carbon atoms;
Q1, Q2, are independently selected from the group consisting of ethylene oxide, polyethylene oxide, propylene oxide, polypropylene oxide and mixtures thereof, wherein the polyethylene oxide has from 2 to 100 total ethylene oxide units and the polypropylene oxide has from 2 to 100 propylene oxide units;
R1', R1" are alkyl groups having a chain with from 1 to 30 carbon atoms;
the number average molecular weight of the cationic part of the cationic polymeric dopant is from about 400 Daltons to about 25,000 Daltons;
Y$^{n-}$ is a counter ion, which is multi-atom anion comprising at least two fluorine atom; wherein n is from 1 to 6; and
the adhesive composition is aqueous.

2. The adhesive composition according to claim 1, wherein the multi-atom counter ion comprises at least three fluorine atoms.

3. The adhesive composition according to claim 1, wherein the adhesive composition comprises from about 0.3 weight % to about 3 weight % of cationic polymeric dopant by weight of the total solids of the adhesive composition.

4. The adhesive composition according to claim 1, wherein the adhesive composition further comprises a material selected from the group consisting of a polyacrylate, a polymethacrylate, a vinyl acrylate, a vinyl methacrylate, and mixtures thereof.

5. The adhesive composition according to claim 1, wherein the adhesive composition further comprises a crosslinker.

6. The adhesive composition according to claim 5, wherein the crosslinker comprises a functional group selected from the group consisting of isocyanate, epoxy, hydroxyl, aziridine, amine, and combinations thereof.

7. The adhesive composition according to claim 1, wherein the counter ion $Y^{n-}$ of the cationic polymeric dopant is selected from the group consisting of trifluoroacetate, trifluoromethyl sulfonate, tetrafluoroborate, 1,1,2,2-tetrafluoroethane sulfonic acid, fluoroantimonic acid, hexafluorophosphate, hexafluorosilicic acid, nonafluorobutanesulfonate, tris(perfluoroalkyl)trifluorophosphate, 2,2,2-trifluoromethylsulfonyl-N-cyanoamide, 2,2,2-trifluoro-N-[(trifluoromethyl)sulfonyl] acetamide, heptadecafluorooctanesulfonic acid, 1,1,1-trifluoro-N-((trifluoromethyl)sulfonyl)methanesulfonamide, bis(perfluoroethylsulfonyl)amide, bis[(trifluoromethyl)sulfonyl]imide, bis(fluorosulfonyl)imide, fluorotrifluoromethylsulfonyl imide, (fluorosulfonyl)(pentafluoroethanesulfonyl)imide, (trifluoromethylsulfonyl)(pentafluoroethanesulfonyl)imide, and (trifluoromethylsulfonyl)(nonafluorobutylsulfonyl)imide.

8. The adhesive composition according to claim 1, the cationic polymeric dopant being represented by Formula IB, Formula IB wherein R8 is selected from a group consisting of alkyl and alkenyl functional groups having from 12 to 18 carbon atoms.

* * * * *